US009337422B2

(12) United States Patent
Cheong et al.

(10) Patent No.: US 9,337,422 B2
(45) Date of Patent: May 10, 2016

(54) CHALCOGENIDE SWITCHING DEVICE USING GERMANIUM AND SELENIUM AND MANUFACTURING METHOD THEREOF

(71) Applicant: KOREA INSTITUTE OF SCIENCE AND TECHNOLOGY, Seoul (KR)

(72) Inventors: Byung-ki Cheong, Seoul (KR); Sudong Kim, Seoul (KR); Suyoun Lee, Yongin-si (KR); Sang-Yeol Shin, Busan (KR); Hyung-Woo Ahn, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 14/242,146

(22) Filed: Apr. 1, 2014

(65) Prior Publication Data
US 2014/0299833 A1    Oct. 9, 2014

(30) Foreign Application Priority Data

Apr. 5, 2013  (KR) ........................ 10-2013-0037445

(51) Int. Cl.
*H01L 45/00*  (2006.01)
(52) U.S. Cl.
CPC .............. *H01L 45/143* (2013.01); *H01L 45/04* (2013.01); *H01L 45/1233* (2013.01); *H01L 45/141* (2013.01); *H01L 45/1625* (2013.01)
(58) Field of Classification Search
CPC . H01L 45/143; H01L 45/1608; H01L 45/141; H01L 45/122
USPC ............................................................ 257/4
See application file for complete search history.

(56) References Cited

U.S. PATENT DOCUMENTS

| 8,148,707 | B2 | 4/2012 | Ovshinsky et al. | |
|---|---|---|---|---|
| 8,796,661 | B2* | 8/2014 | Ramaswamy | H01L 45/04 257/4 |
| 8,878,155 | B2* | 11/2014 | Liu et al. | 257/3 |
| 8,895,401 | B2* | 11/2014 | Campbell | 438/381 |
| 8,912,519 | B2* | 12/2014 | Lee | 257/2 |
| 9,117,998 | B2* | 8/2015 | Ramaswamy | H01L 45/04 |
| 2003/0096497 | A1* | 5/2003 | Moore et al. | 438/652 |

(Continued)

FOREIGN PATENT DOCUMENTS

| JP | 2006-522477 A | 9/2006 |
|---|---|---|
| JP | 2009-510712 A | 3/2009 |

(Continued)

OTHER PUBLICATIONS

Anbarasu, M., et al. "Nanosecond threshold switching of GeTe6 cells and their potential as selector devices." Applied Physics Letters 100. 14 (2012): 143505. (5 pages, in English), Apr. 3, 2012.

(Continued)

*Primary Examiner* — Allan R Wilson
(74) *Attorney, Agent, or Firm* — NSIP Law

(57) ABSTRACT

Disclosed is a method for manufacturing a chalcogenide switching device, which includes forming a first electrode on a substrate, forming a chalcogenide material composed of $Ge_x$ and $Se_{1-x}$ formed on the first electrode, and forming a second electrode on the chalcogenide material, wherein the value x is greater than 0 and smaller than 1. A chalcogenide switching device manufactured by this method is also disclosed.

12 Claims, 8 Drawing Sheets

(56) References Cited

U.S. PATENT DOCUMENTS

| | | | |
|---|---|---|---|
| 2004/0053461 A1* | 3/2004 | Moore et al. | 438/225 |
| 2005/0017233 A1* | 1/2005 | Campbell | 257/2 |
| 2006/0012008 A1* | 1/2006 | Campbell | 257/536 |
| 2006/0186394 A1* | 8/2006 | Campbell | 257/3 |
| 2006/0203430 A1 | 9/2006 | Pinnow et al. | |
| 2007/0023744 A1* | 2/2007 | Campbell et al. | 257/4 |
| 2012/0104343 A1* | 5/2012 | Ramaswamy | H01L 45/04 257/3 |
| 2013/0221309 A1* | 8/2013 | Lee | 257/2 |
| 2014/0312291 A1* | 10/2014 | Ramaswamy | H01L 45/04 257/3 |

FOREIGN PATENT DOCUMENTS

| | | |
|---|---|---|
| KR | 10-2004-0091743 A | 10/2004 |
| KR | 10-2006-0088066 A | 8/2006 |
| KR | 10-2008-0114801 A | 12/2008 |
| WO | WO 03/079443 A2 | 9/2003 |
| WO | WO 2004/081617 A2 | 9/2004 |
| WO | WO 2006/132813 A1 | 12/2006 |
| WO | WO 2007/127014 A2 | 11/2007 |

OTHER PUBLICATIONS

Ahn, Hyung-Woo, et al. "Effects of nitrogen addition on the threshold switching characteristics of amorphous GeSe films" MAP (Non-Volatile Memory Materials and Processes), Sep. 18, 2012. (4 pages, in English).

* cited by examiner

CHALCOGENIDE SWITCHING DEVICE USING GERMANIUM AND SELENIUM AND MANUFACTURING METHOD THEREOF

CROSS-REFERENCE TO RELATED APPLICATION

This application claims priority to Korean Patent Application No. 10-2013-0037445, filed on Apr. 5, 2013, and all the benefits accruing therefrom under 35 U.S.C. §119, the contents of which in its entirety are herein incorporated by reference.

BACKGROUND

1. Field

The present disclosure relates to a switching device using a chalcogenide material and its manufacturing method, and more particularly, to a chalcogenide switching device using germanium (Ge) and selenium (Se) and its manufacturing method.

2. Description of the Related Art

At the present, a chalcogenide material is widely used for a phase-change memory cell as a VI group element such as tellurium (Te) and selenium (Se). The chalcogenide material exhibits a phase change between a resistivity state and a conductivity state.

Such a resistivity-conductivity change is caused by a phase change of a crystalline state and an amorphous state of the chalcogenide material. Since the crystalline state has a low resistance structure, the chalcogenide material exhibits conductivity, and since the amorphous state has a high resistance structure, the chalcogenide material exhibits resistivity. Generally, the phase transformation from the crystalline state to the amorphous state is called a reset, and the phase transformation from the amorphous state to the crystalline state is called a set. In detail, the change from the crystalline state to the amorphous state occurs according to temperature, and such a temperature change is generated by thermal energy (for example, Joule effect at current/voltage and Joule effect at the chalcogenide material) formed by an electric current flowing through the chalcogenide material and a resistive electrode which is in contact with or adjacent to the chalcogenide material. Therefore, assuming that a pulse voltage is applied to a device composed of the chalcogenide material, the phase of the chalcogenide material may be adjusted based on the pulse size.

Different from above, several amorphous chalcogenide materials show another kind of switching phenomenon, so called Ovonic threshold switching. It was firstly reported by S. R. Ovshinsky in 1968. [ref. S. R. Ovshinsky, Phys. Rev. Lett. 21, 1450 (1968)]. This switching is characterized by a huge change in the electrical resistance when the applied voltage exceeds a certain threshold voltage (Vth). Since this switching is volatile, i.e. the chalcogenide material returns to highly resistive state when the bias is removed, a switching device based on this phenomenon is being developed.

The OTS has a high resistance with respect to a voltage lower than a threshold voltage (Vth). If the applied voltage exceeds the threshold voltage (Vth), the OTS experiences a transition from the insulating state to the conducting state, and consequently, the OTS has a low-resistive state. If the voltage across the OTS drops below a holding voltage ($V_H$) or the current flowing through the OTS drops below a holding current ($I_H$), the OTS returns to a high-impedance condition. This operation may be symmetrical and may also be generated with respect to negative voltage and current.

However, the chalcogenide material layer used in the OTS is generally $As_2Se_3$ which uses Arsenic (As). Since As is not an environment-friendly element, it is demanded to use a new material to replace As.

In addition, in the chalcogenide switching device (namely, the OTS device), a high threshold voltage may increase an amount of voltage applied, which may increase power consumption and give a bad influence to the device. Therefore, a necessity for lowering and adjusting the threshold voltage for switching arises.

RELATED LITERATURES

Patent Literature (Patent Literature 1) Korean Unexamined Patent Publication No. 10-2008-0114801

SUMMARY

The present disclosure is directed to providing a method for using an environment-friendly material which may ensure more excellent performance of a chalcogenide switching device in comparison to the case using As and lowering and adjusting a threshold voltage of the switching device, in order to overcome a drawback that a chalcogenide switching device including As is not environment-friendly.

In one aspect, there is provided a chalcogenide switching device, which includes: a first electrode formed on a silicon-on-insulator (SOI) substrate; a chalcogenide material composed of $Ge_x$ and $Se_{1-x}$ formed on the first electrode; and a second electrode formed on the chalcogenide material, wherein the value x is greater than 0 and smaller than 1.

In addition, in the chalcogenide switching device, the value x may be in the range of 0.5 to 0.7.

In addition, in the chalcogenide switching device, the value x may be in the range of 0.55 to 0.65.

In addition, in the chalcogenide switching device, the value x may be 0.6.

In another aspect, there is provided a method for manufacturing a chalcogenide switching device, which includes: forming a first electrode on a SOI substrate; forming a chalcogenide material composed of $Ge_x$ and $Se_{1-x}$ formed on the first electrode; and forming a second electrode on the chalcogenide material, wherein the value x is greater than 0 and smaller than 1.

In addition, in the method for manufacturing a chalcogenide switching device, a threshold voltage of the chalcogenide switching device may be adjusted based on a range of the value x, and the value x may be in the range of 0.5 to 0.7.

In addition, in the method for manufacturing a chalcogenide switching device, a threshold voltage of the chalcogenide switching device may be adjusted based on a range of the value x, and the value x may be in the range of 0.55 to 0.65.

In addition, in the method for manufacturing a chalcogenide switching device, the value x may be 0.6.

In addition, the method for manufacturing a chalcogenide switching device may further include forming a trench on the SOI substrate by etching the SOI substrate, wherein the first electrode may be formed in a part of the trench, and wherein the chalcogenide material may be formed on the first electrode and in the other part of the trench.

In addition, in the method for manufacturing a chalcogenide switching device, the SOI substrate may have a thickness of 300 nm, and the trench has a depth of 200 nm.

According to an embodiment of the present disclosure, it is possible to provide an environment-friendly chalcogenide switching device by using GeSe instead of As. In addition, in GeSe, by adjusting a ratio of Ge and Se to control a threshold voltage of a switching device, it is possible to provide a chalcogenide switching device having an optimal ratio of Ge and Se.

DETAILED DESCRIPTION

Figure 1:
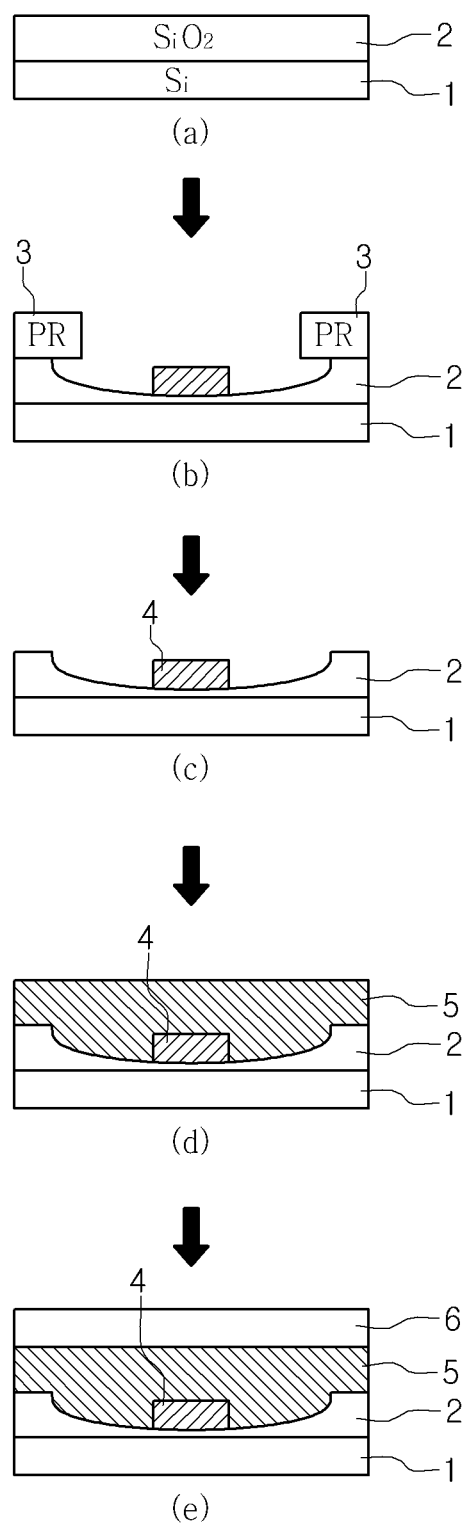
FIG. 1 illustrates a method for manufacturing a chalcogenide switching device according to an embodiment of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. In the drawings, like reference numerals denote like elements. The shape, size and regions, and the like, of the drawing may be exaggerated for clarity.

However, in the description, details of well-known features and techniques may be omitted to avoid unnecessarily obscuring the presented embodiments. In addition, the shape, size and regions, and the like, of the drawing may be exaggerated for clarity and may not mean the actual dimension.

Hereinafter, embodiments of the present disclosure will be described in detail with reference to the accompanying drawings.

FIGS. 1(a) to 1(e) illustrate a method for manufacturing a chalcogenide switching device according to an embodiment of the present disclosure. The chalcogenide switching device according to an embodiment may have a metal-insulator-metal (MIM) shape of a crossbar structure as shown in FIG. 1(e). In order to manufacture the chalcogenide switching device, first, as shown in FIG. 1(a), a Si layer 1 and a SiO2 layer 2 are deposited in order. In other words, an insulator on silicon substrate is formed, and each layer may be deposited by means of any deposition method such as MBE. After that, the SiO2 layer 2 is etched to form a trench. The etching may be performed using a photoresist 3 and a buffered oxide etchant (BOE). After that, the photoresist 3 is removed. Accordingly, as shown in FIG. 1(b), a substrate 1, 2 having a trench may be formed. Here, by forming the trench, a switching characteristic problem according to the thickness of the chalcogenide material may be solved. After that, as shown in FIG. 1(c), a first electrode 4 is formed in a part of the trench on the SiO2 layer 2. After that, as shown in FIG. 1(d), a chalcogenide material 5 is formed on the first electrode and in the other part of the trench. After that, as shown in FIG. 1(e), a second electrode 6 is formed on the chalcogenide material 5.

When manufacturing the chalcogenide switching device, the trench formed by etching the $SiO_2$ layer 2 may have a depth of 200 nm, and in this case, the $SiO_2$ layer 2 may have a thickness of 300 nm. In addition, a ratio of the BOE used for etching may be 6:1. In addition, the first electrode and the second electrode may use any conductive material, preferably Ti having a thickness of 10 nm and TiN having a thickness of 60 nm, deposited by RF sputtering, and the second electrode may be patterned in a lift-off manner.

The chalcogenide material 5 is an amorphous film composed of $Ge_xSe_{1-x}$, and it may be deposited by means of RF magnetron sputtering. In addition, the chalcogenide material 5 may have a thickness of 100 nm. In the chalcogenide material composed of $Ge_xSe_{1-x}$, a ratio of Ge and Se may be obtained through x-ray fluorescence analysis. In addition, the thickness of the chalcogenide material 5 may be from several nanometers to several ten micrometers as demanded, preferably 50 to 150 nm, without being limited thereto.

In the chalcogenide switching device 10 formed through the procedures illustrated in FIG. 1, the following experiment has been conducted to adjust a threshold voltage of the switching device based on the ratio of Ge and Se.

Here, a thin film was generated by means of reactive RF magnetron sputtering, and during the sputtering process, an inert gas, argon, and a nitrogen gas to be mixed to the GeSe thin film were injected together. A gas ratio of nitrogen and argon was respectively adjusted to 0:100, 0.5:95.5, 1:99, and 2:95. At this time, pressure was 0.5 mTorr, and temperature was about 25° C. A deposition ratio was about 0.2 nm/sec.

Figure 2:
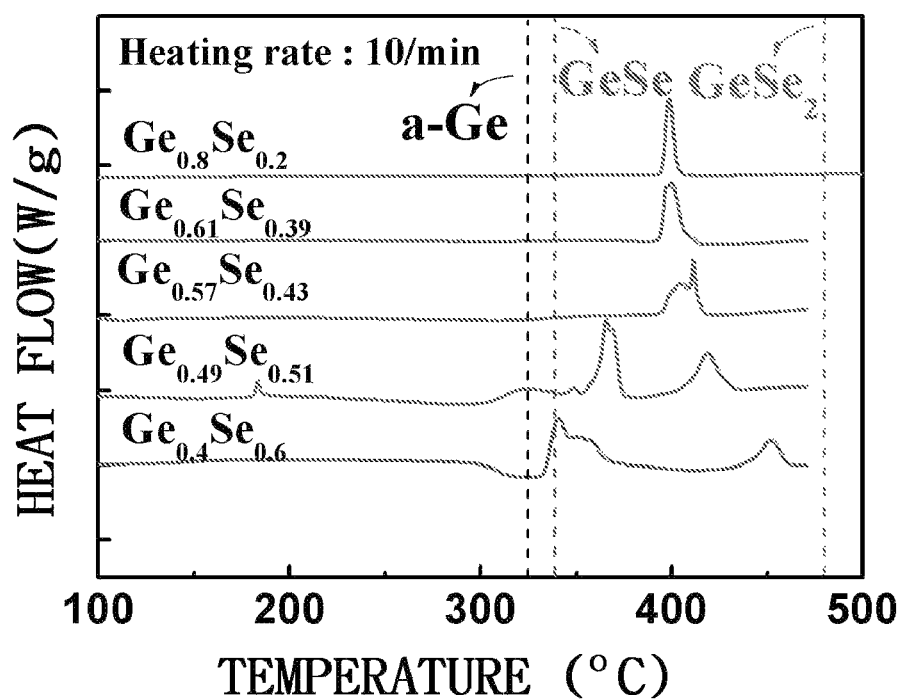
FIG. 2 is a graph showing a heat flow (W/g) according to differential scanning calorimetry (DSC) for each composition of Ge.

FIG. 2 is a graph showing a heat flow (W/g) according to differential scanning calorimetry (DSC) for each composition of Ge. In FIG. 2, a vertical dotted line (a) represents a crystallization temperature of Ge, and vertical dotted lines (b) and (c) respectively represent crystallization temperatures of GeSe and GeSe$_2$. Each peak in the graphs 21-25 of FIG. 2 represents a crystallization temperature of the corresponding chalcogenide material.

Referring to FIG. 2, in the chalcogenide material of GexSe—$_{1-x}$, if x is smaller than 0.5 (Graphs 21 and 22), a plurality of peaks are generated according to the increase of temperature, and thus it may be expected that a phase separation occurred into Ge and GeSe$_2$. However, if x is greater than 0.5 (Graphs 23 to 25), only one peak is generated, and thus it was found that if x is greater than 0.5, it is possible to have a high crystallization temperature at which a phase separation does not occur. Accordingly, the ratio of x may be suitably 0.5 or above, as checked from FIG. 2.

Figure 3:
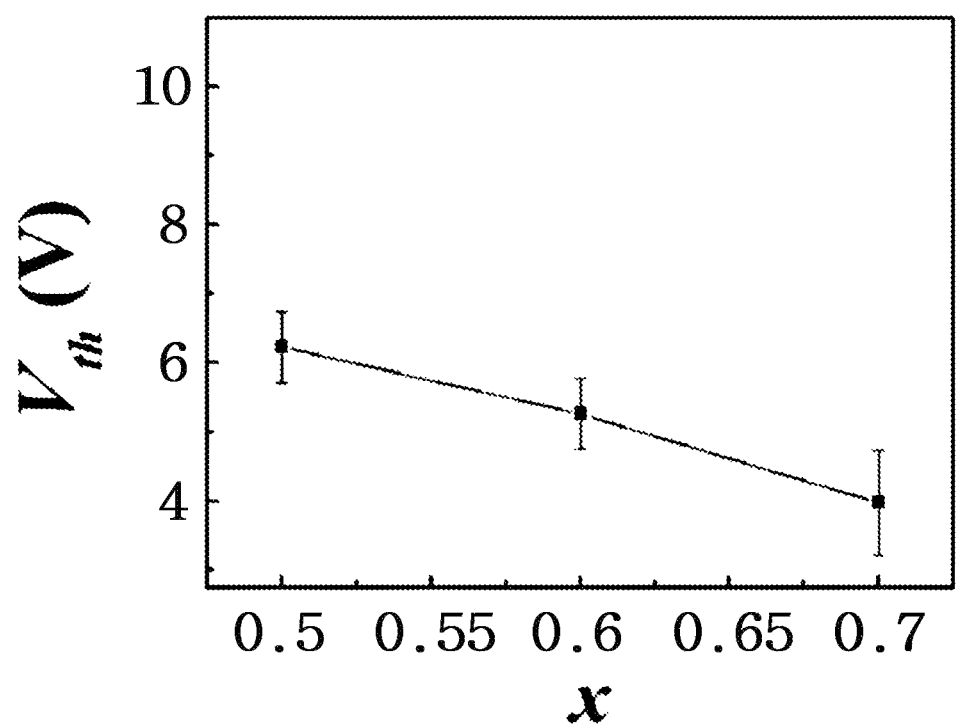
FIG. 3 is a graph showing the change of a threshold voltage according to the content of Ge of a chalcogenide material $Ge_xSe_{1-x}$ (namely, x) in the chalcogenide switching device according to an embodiment of the present disclosure.
Figure 4:
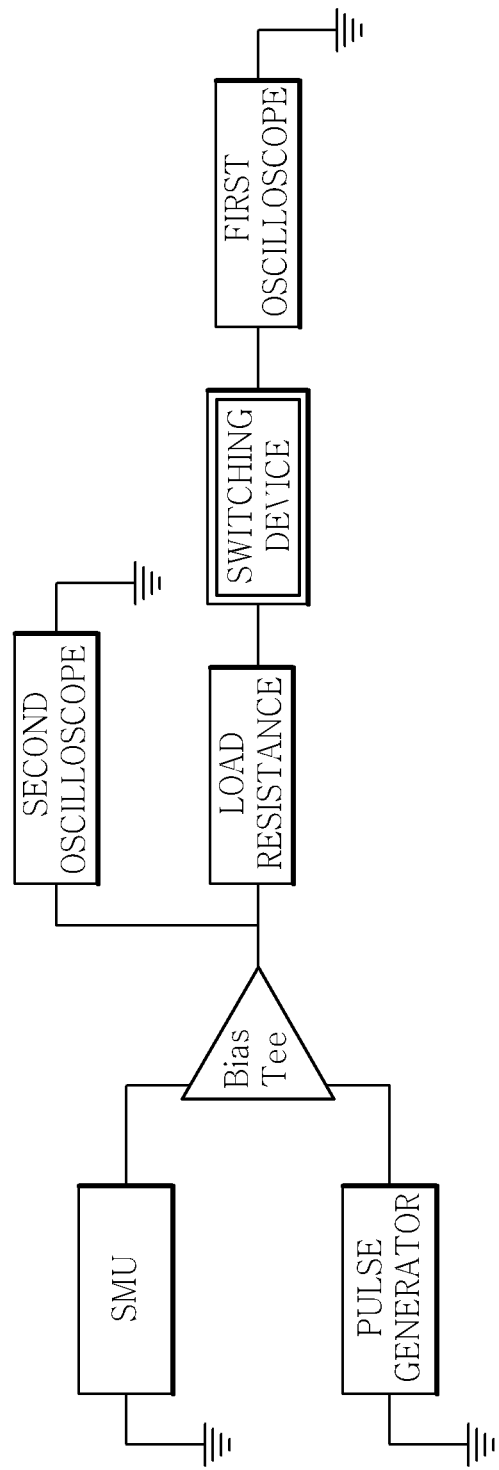
FIG. 4 is a circuit diagram for analyzing electric characteristics of the chalcogenide switching device of the present disclosure.

FIG. 3 is a graph showing the change of a threshold voltage according to the content of Ge of a chalcogenide material Ge$_x$Se$_{1-x}$ (namely, x) in the chalcogenide switching device according to an embodiment of the present disclosure. In addition, FIG. 4 is a circuit diagram for analyzing electric characteristics of the chalcogenide switching device of the present disclosure.

In the graph of FIG. 3, x was measured at 0.5 or above based on the experiment result of FIG. 2. In order to obtain the graph of FIG. 3, the analysis circuit as shown in FIG. 4 may be configured.

Referring to FIG. 3, it may be found that the threshold voltage decreases as the content of Ge increases. In other words, it may be found that in a ratio of Ge$_{0.5}$Se$_{0.5}$, the threshold voltage is about 6V, but in a ratio of Ge$_{0.7}$Se$_{0.3}$, the threshold voltage decreases to about 4V. As a result, it may be found that as the content of Ge increases, the threshold voltage decreases.

Figure 5:
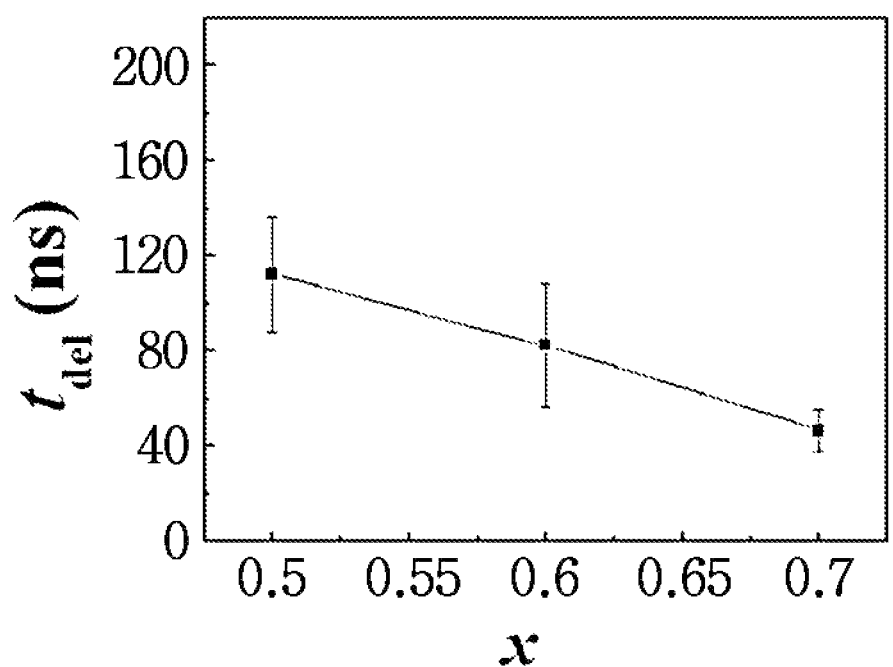
FIG. 5 is a graph showing the change of a delay time ($t_{del}$) according to the content of Ge of a chalcogenide material $Ge_xSe_{1-x}$ (namely, x) in the chalcogenide switching device according to an embodiment of the present disclosure.

FIG. 5 is a graph showing the change of a delay time (t$_{del}$) according to the content of Ge of a chalcogenide material Ge$_x$Se$_{1-x}$ (namely, x) in the chalcogenide switching device according to an embodiment of the present disclosure. In order to obtain the result of FIG. 5, the chalcogenide material 5 has a ratio of Ge$_{0.6}$Se$_{0.4}$, and a pulse of 10V voltage was applied in a rectangular wave form.

Referring to FIG. 5, it may be found that as the content of x increases, a delay time decreases. In other words, based on FIG. 5, if the content of Ge increases, the delay time decreases, and thus a rapid operation of the device may be expected. Here, the delay time means a time taken from a point when a switching input is received till a point when the device actually performs switching.

Figure 6:
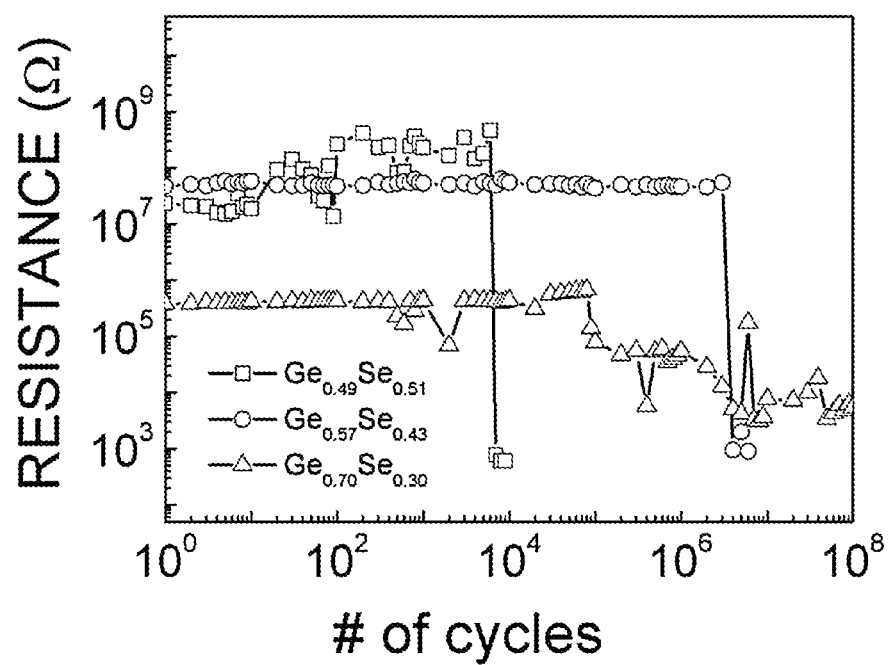
FIG. 6 is a graph comparatively showing operation durability according to the content of Ge of a chalcogenide material $Ge_xSe_{1-x}$ (namely, x) in the chalcogenide switching device according to an embodiment of the present disclosure.

FIG. 6 is a graph comparatively showing operation durability according to the content of Ge of a chalcogenide material Ge$_x$Se$_{1-x}$ (namely, x) in the chalcogenide switching device according to an embodiment of the present disclosure. In FIG. 6, the test was performed while setting the value x to 0.5, 0.6 and 0.7 for example.

Referring to FIG. 6, as the test is performed more, the resistance of the device changes irregularly. In particular, if x is 0.5, the resistance exhibits a great change at a test cycles of $10^4$ for the first time, and if x is 0.7, the resistance exhibits irregular changes at a test cycles of $10^5$. Meanwhile, when x is 0.6, the resistance value does not change until a greatest test cycles (about $10^6$). Accordingly, it may be found that in Ge$_x$Se$_{1-x}$, durability is most excellent when x is about 0.6.

From the above result, it may be found that the chalcogenide material 5 (Ge$_x$Se$_{1-x}$) may be suitably used for the switching device when x is 0.5 or above, and switching characteristics and durability are excellent when x is 0.6.

Figure 7:
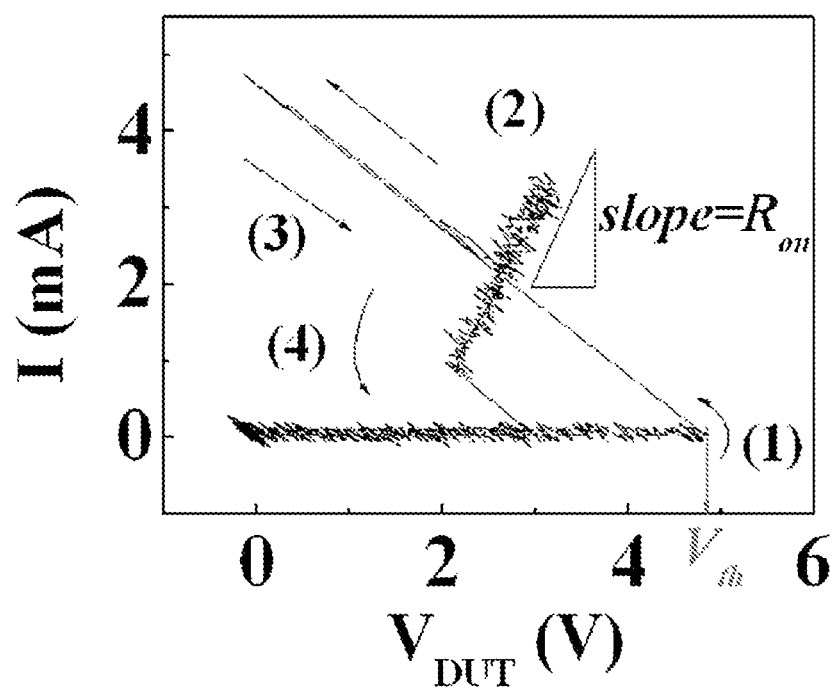
FIG. 7 is a graph showing a V-I relation of the chalcogenide switching device according to an embodiment of the present disclosure.

FIG. 7 is a graph showing a relation of the chalcogenide switching device according to an embodiment of the present disclosure. The graph of FIG. 7 shows a relation of the chalcogenide switching device when the value x of FIG. 3 is 0.6.

Referring to FIG. 7, the threshold voltage is about 4.8V, and it may be found that current flows when a voltage exceeds the threshold voltage.

Figure 8:
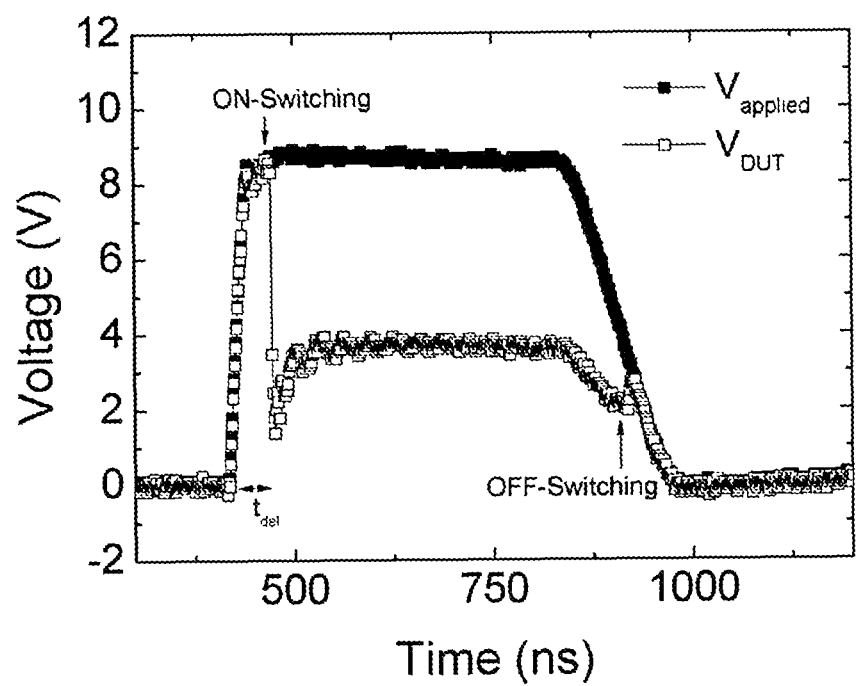
FIG. 8 is a graph showing the waveform of the applied voltage pulse and the response pulse of the chalcogenide switching device according to an embodiment of the present disclosure.

FIG. 8 is the waveform of the applied voltage pulse and the response pulse of the chalcogenide switching device according to an embodiment of the present disclosure. The chalcogenide material used in FIG. 8 employs a chalcogenide switching device having a ratio of Ge$_{0.6}$Se$_{0.4}$. Referring to FIG. 8, with respect to an input rectangular voltage (V$_{applied}$), the switching device has a delay time (t$_{del}$) of about 80 ns.

The chalcogenide material of the present disclosure uses a GeSe alloy, which was not used in a general switching device, and it may be found that as the content of Ge is greater in the ratio, the threshold voltage of the switching device decrease and thus the switching characteristic is improved. This result is because a density in a localized state decreases due to the reduction of bonding such as chains among chalcogenide elements.

The chalcogenide switching device using GeSe as described above may be applied to all fields using an OTS device and may be used as an environment-friendly device not including As.

Even though it has been illustrated that the electrodes are located at upper and lower portions of the chalcogenide material, the present disclosure is not limited thereto, and the electrodes may have any configuration if they may electrically communicate with the chalcogenide material.

Though the present disclosure has been described with reference to the embodiments depicted in the drawings, it should be understood by those skilled in the art that various modifications and equivalents can be made from the disclosure.

What is claimed is:

1. A chalcogenide switching device, comprising:
   a first electrode formed on a substrate;
   a chalcogenide material consisting essentially of Ge$_x$Se$_{1-x}$ formed on the first electrode; and
   a second electrode formed on the chalcogenide material,
   wherein the value x is greater than 0.5 and smaller than 1, and
   wherein each of the first electrode and the second electrode is in direct contact with the chalcogenide material.

2. The chalcogenide switching device according to claim 1, wherein the value x is greater than 0.5 and smaller than 0.7.

3. The chalcogenide switching device according to claim 2, wherein the value x is in the range of 0.55 to 0.65.

4. The chalcogenide switching device according to claim 3, wherein the value x is 0.6.

5. The chalcogenide switching device according to claim 1, wherein the substrate comprises a silicon layer and a silicon oxide layer.

6. A method for manufacturing a chalcogenide switching device, comprising:
   forming a first electrode on a substrate;
   forming a chalcogenide material consisting essentially of Ge$_x$Se$_{1-x}$ formed on the first electrode; and
   forming a second electrode on the chalcogenide material,
   wherein the value x is greater than 0.5 and smaller than 1, and
   wherein each of the first electrode and the second electrode is in direct contact with the chalcogenide material.

7. The method for manufacturing a chalcogenide switching device according to claim 6,
   wherein a threshold voltage of the chalcogenide switching device is adjusted based on a range of the value x, and
   wherein the value x is greater than 0.5 and smaller than 0.7.

8. The method for manufacturing a chalcogenide switching device according to claim 7,
   wherein a threshold voltage of the chalcogenide switching device is adjusted based on a range of the value x, and
   wherein the value x is in the range of 0.55 to 0.65.

9. The method for manufacturing a chalcogenide switching device according to claim 6,
   wherein the value x is 0.6.

10. The method for manufacturing a chalcogenide switching device according to claim 6, further comprising:
    forming a trench on the substrate by etching the substrate,
    wherein the first electrode is formed in a part of the trench, and
    wherein the chalcogenide material is formed on the first electrode and in the other part of the trench.

11. The method for manufacturing a chalcogenide switching device according to claim 10, wherein the substrate has a thickness of 300 nm, and the trench has a depth of 200 nm.

12. The method for manufacturing a chalcogenide switching device according to claim 6, further comprising:
    forming the substrate by depositing a silicon oxide layer on a silicon layer.

\* \* \* \* \*